(12) United States Patent
Sharp et al.

(10) Patent No.: US 9,353,702 B2
(45) Date of Patent: May 31, 2016

(54) TOP DECK SURFACE COATING OF ENGINE BLOCK

(71) Applicant: CATERPILLAR INC., Peoria, IL (US)

(72) Inventors: Robert E. Sharp, Corinth, MS (US); Adam William Ostein, Corinth, MS (US); Curtis John Graham, Peoria, IL (US); Jarrod David Moss, Corinth, MS (US); Bharat Kumar Meduru, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 14/473,627

(22) Filed: Aug. 29, 2014

(65) Prior Publication Data

US 2016/0061143 A1    Mar. 3, 2016

(51) Int. Cl.
| | |
|---|---|
| *C23C 4/00* | (2006.01) |
| *F02F 7/00* | (2006.01) |
| *F02F 1/00* | (2006.01) |
| *F02F 1/02* | (2006.01) |
| *C23C 4/12* | (2016.01) |

(52) U.S. Cl.
CPC ............... *F02F 7/0095* (2013.01); *C23C 4/125* (2013.01); *F02F 1/004* (2013.01); *F02F 1/02* (2013.01); *F02F 7/0002* (2013.01); *F02F 7/0085* (2013.01)

(58) Field of Classification Search
CPC ..... F02F 7/0095; F02F 7/0085; F02F 7/0002; F02F 1/004; F02F 1/02; C23C 14/042; C23C 4/131; C23C 4/00; C23C 14/028; C23C 4/02
See application file for complete search history.

(56) References Cited

U.S. PATENT DOCUMENTS

| | | | | |
|---|---|---|---|---|
| 4,027,367 | A | 6/1977 | Rondeau | |
| 5,573,814 | A * | 11/1996 | Donovan | B05B 15/0462 427/236 |
| 5,820,939 | A | 10/1998 | Popoola et al. | |
| 5,976,704 | A | 11/1999 | McCune | |
| 6,395,090 | B1 * | 5/2002 | Shepley | B05B 15/045 118/504 |
| 6,719,847 | B2 * | 4/2004 | Rice | B05B 15/045 118/504 |
| 7,823,284 | B2 * | 11/2010 | Takahashi | B05B 15/0431 118/306 |

FOREIGN PATENT DOCUMENTS

CN    102877017 A    1/2013

* cited by examiner

*Primary Examiner* — Ryan J Walters
(74) *Attorney, Agent, or Firm* — Procopio, Cory, Hargreaves & Savitch LLP

(57) ABSTRACT

A method of manufacturing an engine block is disclosed. In one embodiment, the method includes providing an engine block including a cylinder bore and a top deck with a head face including a predetermined surface roughness. The method also includes masking the cylinder bore with a masking plug, the masking plug being located at a predetermined insertion distance measured from a masking plug outer surface to the head face. The method further includes applying a corrosion resistant coating to the top deck over the head face and machine finishing the engine block including the coating to the engine block specifications.

18 Claims, 6 Drawing Sheets

TOP DECK SURFACE COATING OF ENGINE BLOCK

TECHNICAL FIELD

The present disclosure generally pertains to a top deck of an engine block, and is directed toward a surface coating for protecting the top deck from corrosion.

BACKGROUND

Internal combustion engines operate at high temperatures and pressures. The engine block often includes cooling passages. The operating conditions and coolant leaks may lead to pitting, erosion, and corrosion on the head face(s) of the top deck. The pitting, erosion, and corrosion may reduce the operating life of the engine block.

U.S. Pat. No. 4,027,367 to H. Rondeau discloses an alloy of nickel and aluminum, which may contain varying percentages of intermetallics, in the form of a wire or rod that is sprayed in an electric arc spray gun to form a self-bonding coating on a smooth, clean substrate. Alternatively an alloy of nickel and titanium, which also may contain varying percentages of intermetallics, in the form of a wire may be similarly electric arc sprayed to effect a self-binding coating on a substrate. The nickel aluminum alloy and possibly intermetallics or the nickel titanium alloy and possibly intermetallics are supplied as a wire feed to the electric arc spray gun, and when heated in the electric arc of the spray gun and sprayed onto a substrate will form a coating that has a high degree of tenacity to many metal substrates and also has a moderate degree of hardness, low $R_c$, high $R_b$. The self-bonding is attributed to the formation of superheated liquid in the arc process and the affinity of that superheated liquid to iron, nickel, aluminum, etc.

The present disclosure is directed toward overcoming one or more of the problems discovered by the inventors or that is known in the art.

SUMMARY OF THE DISCLOSURE

A method of manufacturing an engine block is disclosed. In one embodiment, the method includes providing an engine block including a block body and a cylinder bore, the block body including a top deck with a head face and the cylinder bore extending into the block body from the head face, the head face including a predetermined surface roughness. The method also includes masking the cylinder bore with a masking plug, the masking plug being located at a predetermined insertion distance measured from a masking plug outer surface to the head face. The method further includes applying a corrosion resistant coating to the top deck over the head face after masking the cylinder bore with the masking plug. The method yet further includes removing the masking plug from the cylinder bore. The method still further includes machine finishing the engine block including the coating to the engine block specifications.

DETAILED DESCRIPTION

The systems and methods disclosed herein include an engine block with a top deck. A corrosion resistant coating is applied to the one or more head faces of the top deck to reduce/prevent corrosion on the top deck. In embodiments, the various features that interface with the one or more head faces, such as the cylinder bores, bolt holes, coolant passages, and lifter windows, are plugged. Masking plugs may be used and inserted using an insertion tool to locate the masking plugs relative to the head face and ensure enough coating material is applied at the edges between the features and the head surface.

Figure 1:
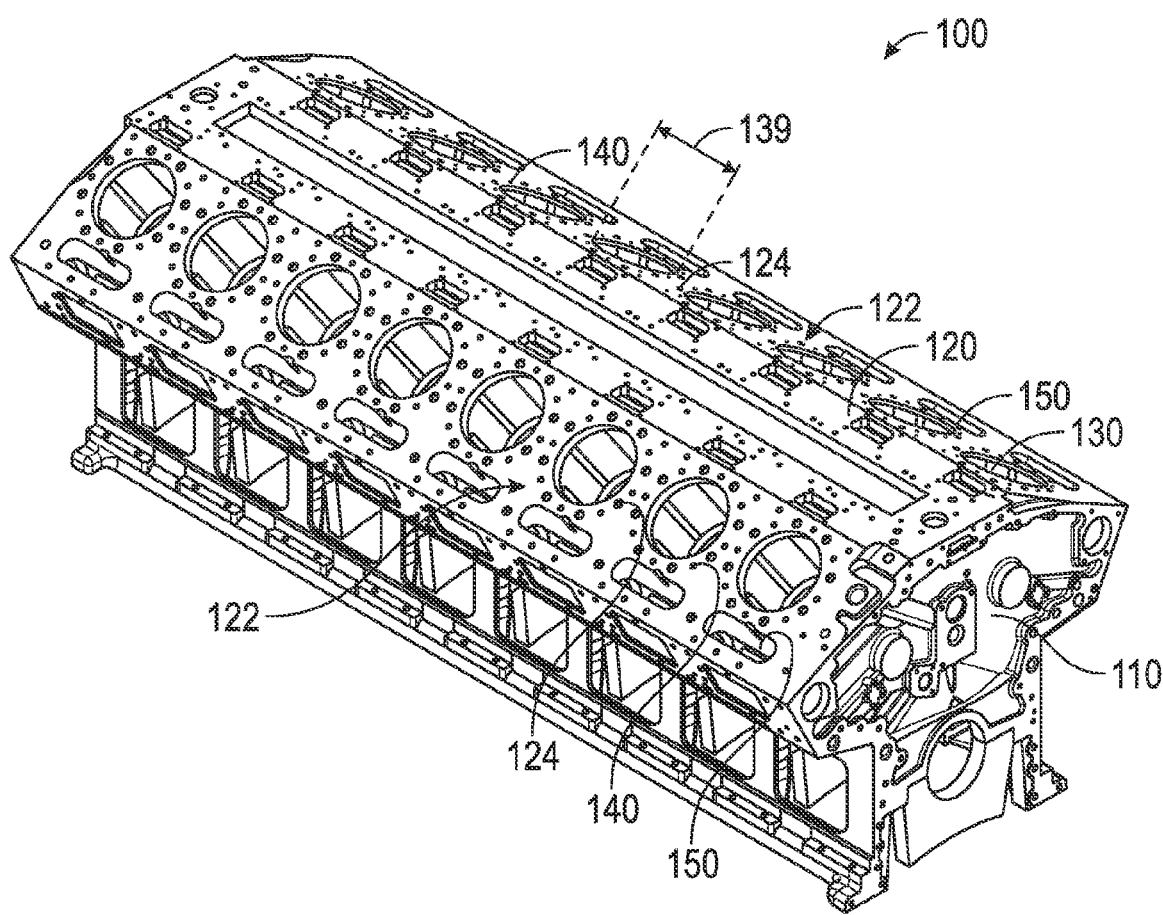
FIG. 1 is a perspective view of an engine block.

FIG. 1 is a perspective view of an engine block 100. Engine block 100 includes, inter alia, a block body 110, cylinder bores 130, and a top deck 120. Block body 110 may be a cast iron block formed with the various features of engine block 100 therein. Cylinder bores 130 extend into the block body 110 and are formed and sized to receive the cylinders of the engine.

Top deck 120 is located along the top portion of block body 110. Top deck 120 includes one or more head faces 122. Cylinder bores 130 generally extend from the head face(s) 122 into block body 110. Cylinder bores 130 each include a cylinder bore diameter 139. The cylinder heads are attached to block body 110 at the head faces 122. In some embodiments, cylinder bores 130 are arranged in a 'V' configuration and top deck 120 includes two head faces 122. In other embodiments, cylinder bores 130 are arranged in an in-line configuration and top deck 120 includes a single head face 122. Other configurations may also be used.

Engine block 100 may also include various other features extending from the head face(s) 122 into block body 110, such as bolt holes 124, coolant passages 140, and lifter windows 150. Bolt holes 124 may be located adjacent cylinder bores 130. Bolt holes 124 are configured to secure the cylinder head(s) to the engine block 100 over the cylinder bores 130. Coolant passages 140 may also be located adjacent cylinder bores 130 and are configured to cool block body 110. Lifter windows 150 may be aligned along a side of the head face(s) 122. Each lifter window 150 may be located between a cylinder bore 130 and an edge of a head face 122.

Figure 2:
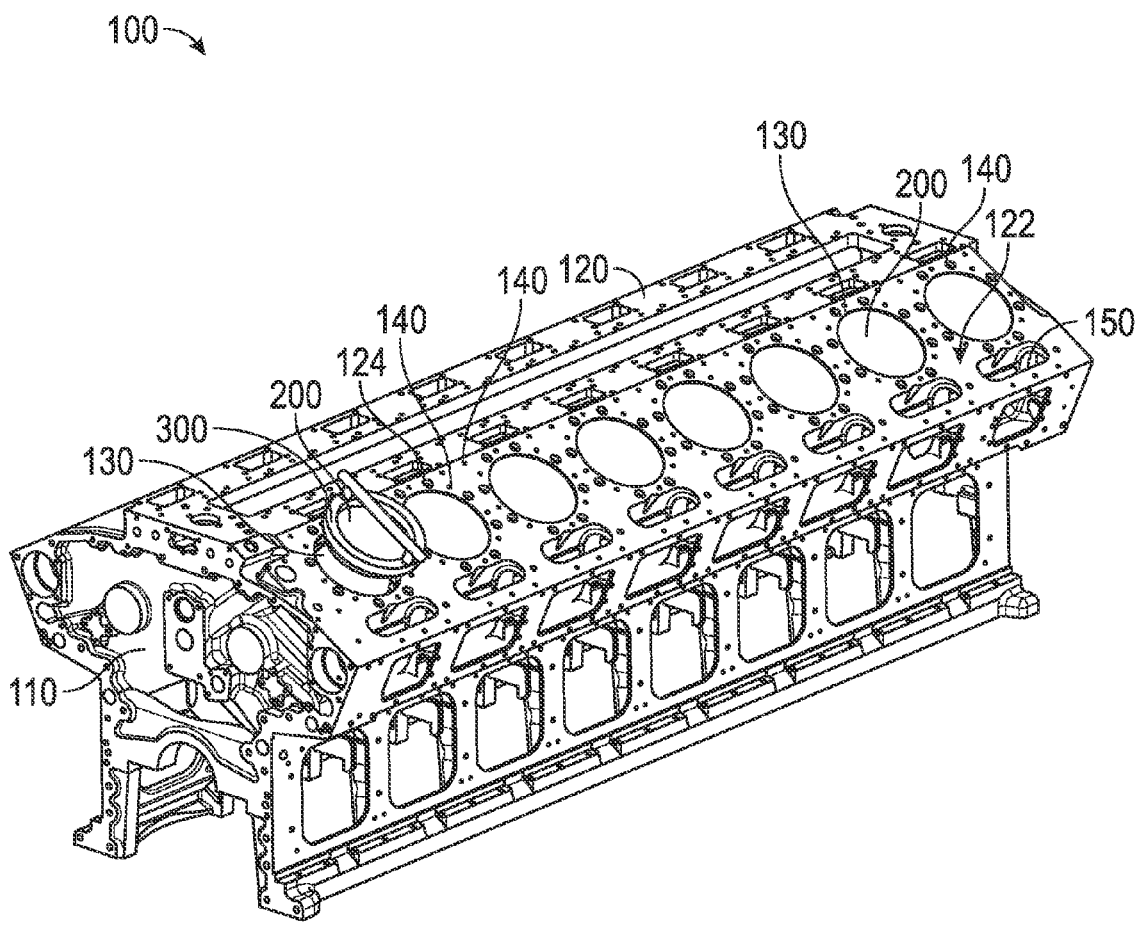
FIG. 2 is an alternate perspective view of the engine block of FIG. 1 including masking plugs and an insertion tool.

A corrosion resistant coating is applied to the head face(s) 122 to prevent pitting, erosion, and corrosion on the head face(s) 122 of the top deck 120, substantially covering the head face(s) 122. FIG. 2 is an alternate perspective view of the engine block 100 of FIG. 1 including masking plugs 200 and an insertion tool 300. Prior to applying the corrosion resistant coating to head face(s) 122 cylinder bores 130 are masked using masking plugs 200. Masking plugs 200 may be cylindrically shaped. Masking plugs 200 may be formed of, inter alia, plastic, silicone rubber, wood, or a composite material.

The other features extending from or to head face(s) 122 may also be masked. Masking plugs 200 of different sizes and shapes may be used to mask the other features extending from or to head face(s) 122, such as bolt holes 124, coolant passages 140, and lifter windows 150. Other means to mask bolt holes 124, coolant passages 140, and lifter windows 150 may also be used.

Figure 3:
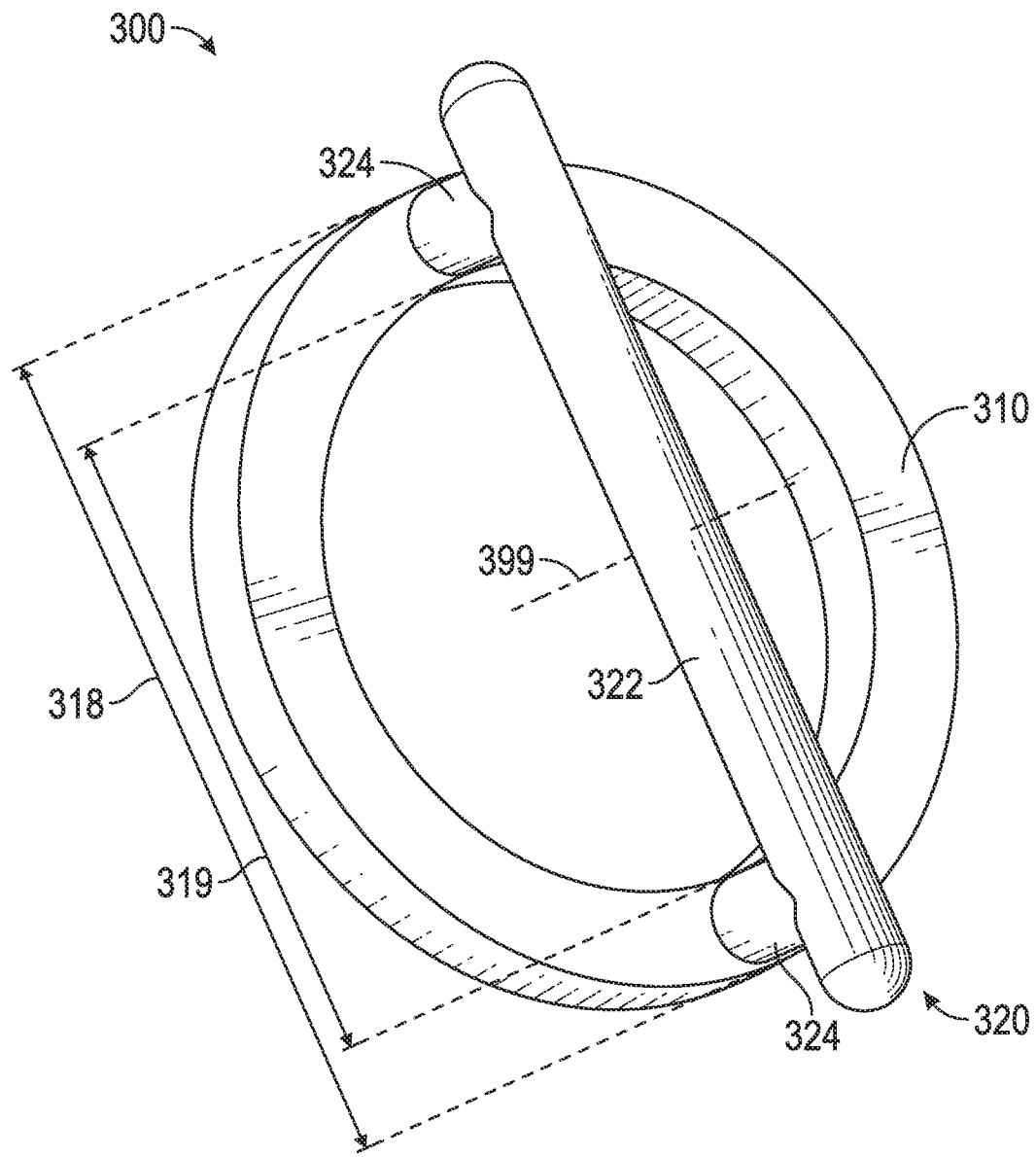
FIG. 3 is a perspective view of the insertion tool of FIG. 2.

Insertion tool 300 may be used to control the location of masking plugs 200 within cylinder bores 130. FIG. 3 is a perspective view of the insertion tool 300 of FIG. 2. Insertion tool 300 includes a tool body 310 and a tool handle 320. Tool body 310 is sized to contact head face 122 about a cylinder bore 130 while inserting a masking plug 200 into the cylinder bore 130. In The embodiment illustrated, tool body 310 includes a toroid shape formed by revolving a rectangular shape around an axis with a tool body outer diameter 318 and a tool body inner diameter 319.

Tool handle 320 may include a handle grip 322 and one or more handle posts 324 connecting handle grip 322 to tool body 310. In the embodiment illustrated, handle grip 322 is a cylindrical bar with a length at least the size of tool body outer diameter 318. In the embodiment illustrated, a handle post 324 is adjacent each end of handle grip 322 extending from the handle grip 322 to tool body 310.

Figure 4:
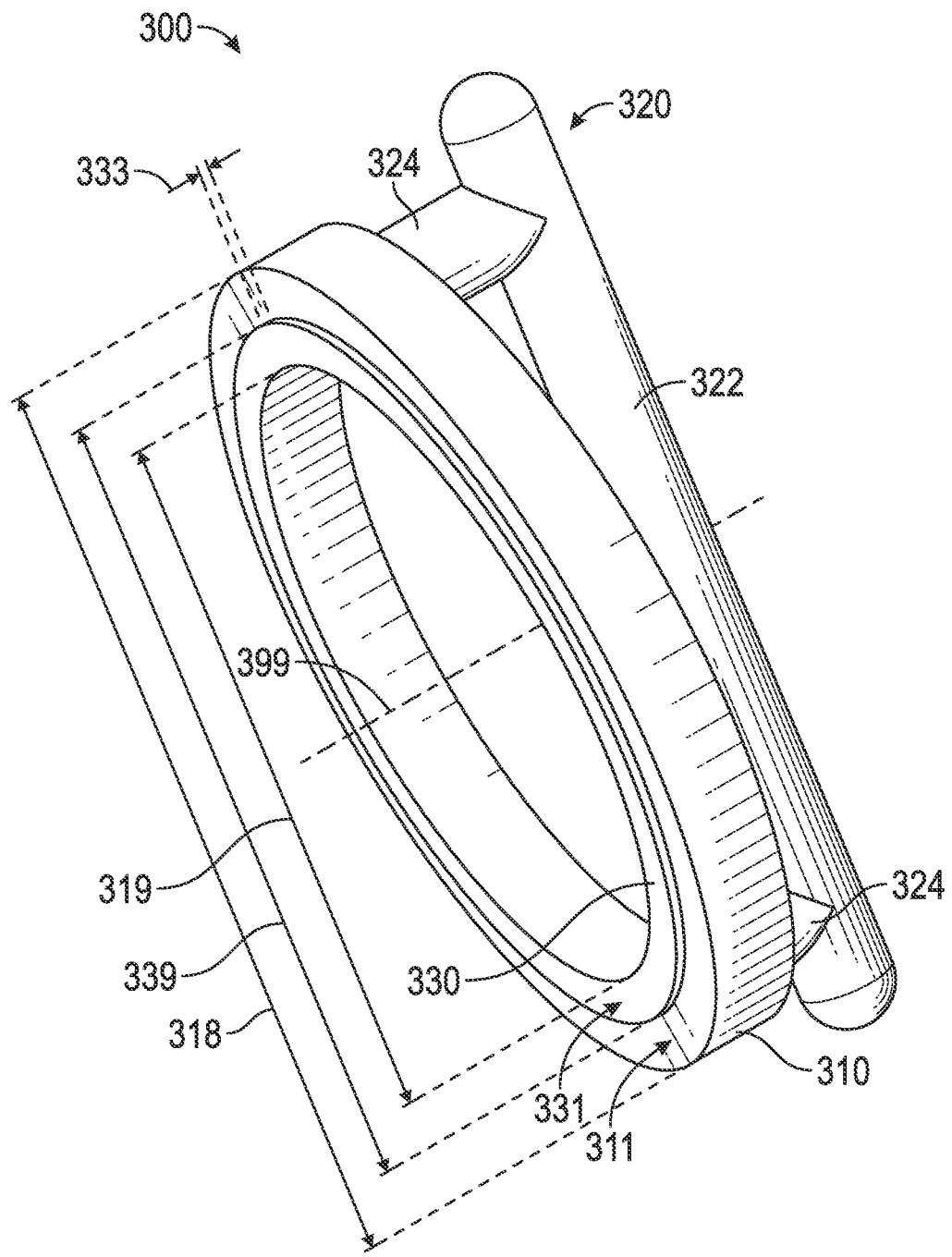
FIG. 4 is an alternate perspective view of the insertion tool of FIG. 3.

FIG. 4 is an alternate perspective view of the insertion tool 300 of FIG. 3. Tool body 310 includes a tool body surface 311. Tool body surface 311 may be opposite tool handle 320 and is configured to contact head face 122 about cylinder bore 130 when installing a masking plug 200. In the embodiment illustrated, tool body surface 311 is an annulus.

Insertion tool 300 also includes an insertion feature 330. Insertion feature 330 extends from tool body 310 and is located at least partially within cylinder bore 130 when installing a masking plug 200 within a cylinder bore 130. Insertion feature 330 may be two or more protrusions, or may be a continuous protrusion. In the embodiment illustrated, insertion feature 330 is a toroid that is located radially inward from tool body surface 311.

Insertion feature 330 may include an insertion feature outer diameter 339. Insertion feature outer diameter 339 is smaller than tool body outer diameter 318 and cylinder bore diameter 139. Insertion feature 330 includes insertion feature surface 331. Insertion feature surface 331 is offset from tool body surface 311 at an insertion feature height 333. Insertion feature height 333 is the axial length of insertion feature 330. Insertion feature surface 331 may be a continuous surface or may be a collection of surfaces at insertion feature height 333. In the embodiment illustrated, insertion feature surface 331 is an annulus.

Figure 5:
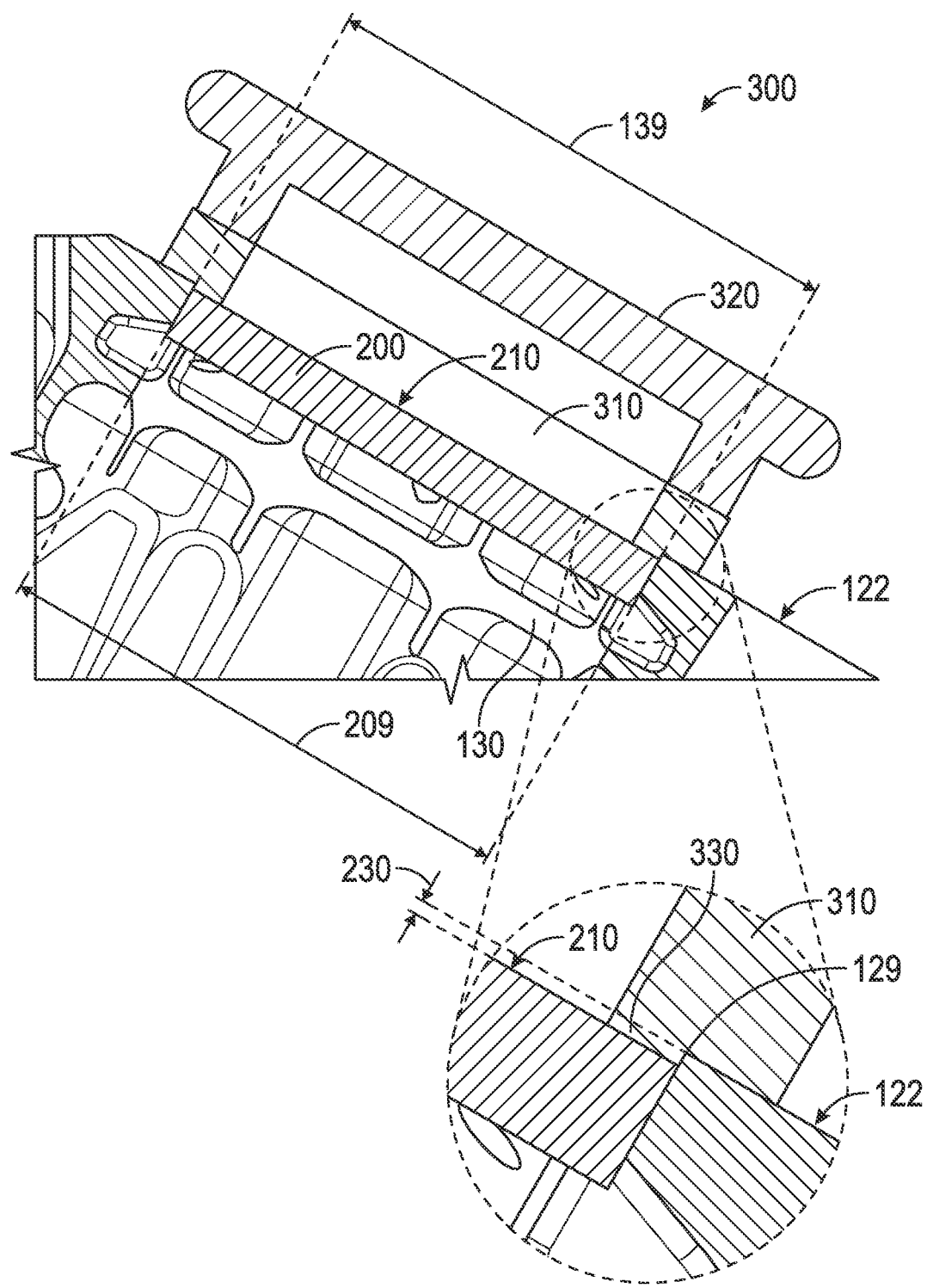
FIG. 5 is a cross-sectional view of the engine block, a masking plug, and the insertion tool of FIG. 2.

FIG. 5 is a cross-sectional view of the engine block 100, a masking plug 200, and the insertion tool 300 of FIG. 2. Masking plugs 200 may include a masking plug diameter 209 that is larger than cylinder bore diameter 139 to create an interference fit when masking plugs 200 are inserted into cylinder bores 130.

Each masking plug 200 includes a masking plug outer surface 210, the surface facing outward when the masking plug 200 is inserted into a cylinder bore 130. Each masking plug 200 is inserted into a cylinder bore 130 at an insertion distance 230 below a head face 122 and spaced apart from the cylinder edge 129, the edge between the cylinder bore 130 and the head face 122. Insertion distance 230 is the predetermined distance between masking plug outer surface 210 and head face 122. In one embodiment, the insertion distance 230 is at least 0.050 millimeters. In another embodiment, the insertion distance 230 is from 0.050 millimeters to 6.0 millimeters. In yet a further embodiment, the insertion distance 230 is from 1.0 millimeters to 3.0 millimeters. In some embodiments, masking plugs 200 located in the other features, such as bolt holes 124, coolant passages 140, and lifter windows 150, protrude up to 4 millimeters beyond head face 122.

Figure 6:
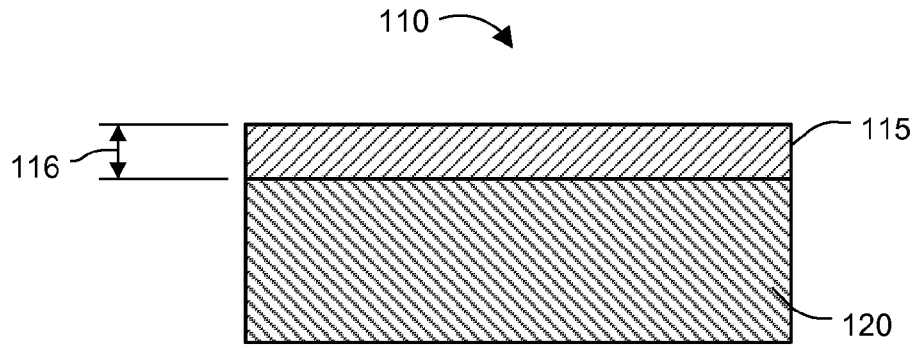
FIG. 6 is a cross-section of the engine block 100 of FIG. 1 illustrating the coating applied to the top deck.

After masking the cylinder bores 130 along with the other features, a coating is applied to the head face 122. FIG. 6 is a cross-section of the engine block 100 of FIG. 1 illustrating the coating 115 applied to the top deck 120. Coating 115 is a corrosion resistant coating. Coating 115 may be a nickel-aluminum alloy. In some embodiments, coating 115 is 80 to 95 percent nickel and 5 to 20 percent aluminum. Coating 115 may be formed from 95/5 nickel aluminum feedstock. Some oxides may be present in coating 115 due to the introduction of oxygen during the coating process. Coating 115 may also include other incidental impurities. The coating may include a coating thickness 116 from 0.050 millimeters to 3.0 millimeters.

INDUSTRIAL APPLICABILITY

Internal combustion engines with cast iron engine blocks may be suited for use in automobiles and in heavy duty vehicles. The engine blocks used in heavy duty vehicles may operate in harsh environments and may be subject to pitting, erosion, and corrosion in the head face.

An engine block 100 including a corrosion resistant coating 115 may reduce or prevent pitting, erosion, and corrosion in the head face 122, such as by protecting the cast iron material from chemical attacks caused by coolant leaks. The coating 115 may be applied during manufacturing of new engine blocks 100 or during remanufacturing of used engine blocks 100 to extend the service life of the engine blocks 100.

Figure 7:
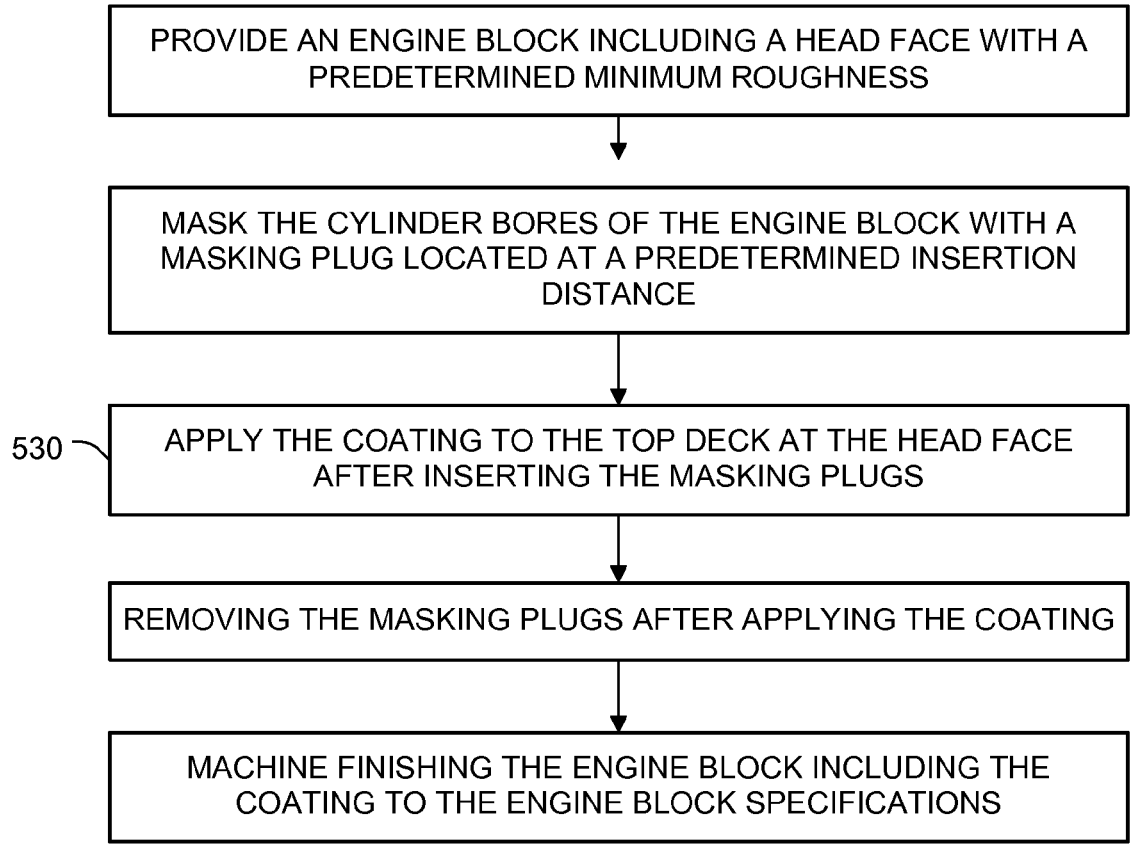
FIG. 7 is a flowchart of a method for applying the coating to the top deck.

FIG. 7 is a flowchart of a method for applying the coating 115 to the top deck 120. The method includes providing an engine block 100 including a head face 122 with a predetermined surface roughness at step 510. In one embodiment, the surface roughness is at least 2032 nanometers (80 microinches). In other embodiments, the surface roughness is at least 3172 nanometers (125 microinches). In yet other embodiments, the surface roughness is from 2032 nanometers (80 microinches) to 3172 nanometers (125 microinches). In the manufacture of new engine blocks 100, the engine block 100 may be cast with the minimum roughness or may be pre-machined to include the minimum roughness. In the remanufacturing of engine blocks 100, the engine block 100 may be pre-machined to roughen the head face 122 to include the minimum roughness. A layer of the top deck 120 may be removed from the head face 122 during the pre-machining process.

The method also includes masking the cylinder bores 130 of the engine block 100 with a masking plug 200 located at a predetermined insertion distance 230 at step 520. Inserting the masking plug 200 at the insertion distance 230 may ensure that enough material is applied to the cylinder edge 129 and to the portions of the surfaces adjacent cylinder edge 129 for final machining to specification. The masking plugs 200 may be inserted and located using the insertion tool 300 by using the insertion feature 330 to push the masking plug 200 into the cylinder bore 130 until the tool body surface 311 contacts head face 122. The other features in the block body 110 in head face 122 may also be masked using masking plugs 200. The masking plugs 200 in these features may protrude up to 4 millimeters from head face 122.

In some embodiments, masking the cylinder bore 130 also includes applying an anti-bond paint to the cylinder bore 130 prior to inserting the masking plug 200 into the cylinder bore 130. A layer of material may be removed from cylinder edge 129. Removing this layer of material may form a small chamfer at cylinder edge 129 and may ensure that the anti-bond paint is not present on cylinder edge 129 when the coating is applied, which allows the coating 115 to adhere to cylinder edge 129.

The method further includes applying the coating 115 to top deck 120 at head face 122 after inserting the masking plugs 200 at step 530. Coating 115 may be applied to substantially cover the head face 122. The coating 115 may be applied using a wire arc spray method and may be applied using a 95/5 feedstock of nickel and aluminum. The coating 115 may be applied at a thickness of at least 0.050 millimeters.

The method yet further includes removing the masking plugs 200 after applying the coating 115 at step 540. The masking plugs 200 may be removed by machining or may be removed using a removal tool, such as pliers. The removal process may be determined by the material used for the masking plugs 200.

The method still further includes machine finishing the engine block 100 including the coating 115 to the engine block specifications at step 550. In some embodiments, step 550 is performed after step 540. In other embodiments, step 550 is performed prior to step 540.

The preceding detailed description is merely exemplary in nature and is not intended to limit the invention or the application and uses of the invention. The described embodiments are not limited to use in conjunction with a particular type of engine block. Hence, although the present disclosure, for convenience of explanation, depicts and describes a particular engine block, it will be appreciated that the coating and the method for applying the coating in accordance with this disclosure can be implemented in various other configurations, and can be used with various other types of engine blocks. Furthermore, there is no intention to be bound by any theory presented in the preceding background or detailed description. It is also understood that the illustrations may include exaggerated dimensions to better illustrate the referenced items shown, and are not consider limiting unless expressly stated as such.

What is claimed is:

1. A method of manufacturing an engine block, the method comprising:
    providing an engine block including a block body and a cylinder bore, the block body including a top deck with a head face and the cylinder bore extending into the block body from the head face, the head face including a predetermined surface roughness;
    masking the cylinder bore including inserting a masking plug into the cylinder bore, the masking plug being located at a predetermined insertion distance measured from a masking plug outer surface to the head face;
    applying a corrosion resistant coating to the top deck over the head face after masking the cylinder bore with the masking plug;
    removing the masking plug from the cylinder bore; and
    machine finishing the engine block including the coating to the engine block specifications.

2. The method of claim 1, wherein masking the cylinder bore with the masking plug includes inserting the masking plug using an insertion tool, the insertion tool including a tool body and an insertion feature extending from the tool body the length of the predetermined insertion distance, by using the insertion feature to push the masking plug into the cylinder bore.

3. The method of claim 2, wherein the tool body includes a tool body surface and the insertion tool is used to push the masking plug into the cylinder bore until the tool body surface contacts the head face.

4. The method of claim 1, wherein the predetermined insertion distance is at least 0.050 millimeters.

5. The method of claim 1, wherein the predetermined insertion distance is from 0.050 millimeters to 6 millimeters.

6. The method of claim 1, wherein masking the cylinder bore includes applying an anti-bond paint to the cylinder bore prior to inserting the masking plug into the cylinder bore and removing a layer of material from a cylinder edge located at an intersection of the cylinder bore and the head face.

7. The method of claim 1, further comprising masking other features in the block body located in the top deck including bolt holes, coolant passages and lifter windows by inserting masking plugs into the bolt holes, coolant passages, and lifter windows with the masking plugs protruding up to 4 millimeters from the head face.

8. The method of claim 1, wherein applying the corrosion resistant coating to the top deck over the head face includes applying a 95/5 feedstock of nickel and aluminum using a wire arc spray method.

9. The method of claim 1, wherein the corrosion resistant coating includes from 80 to 95 percent nickel and from 5 to 20 percent aluminum.

10. A method of remanufacturing an engine block including a block body and a cylinder bore, the block body including a top deck with a head face and the cylinder bore extending into the block body from the head face, the method comprising:
    roughening the head face to a predetermined surface roughness;
    inserting a masking plug into the cylinder bore using an insertion tool to locate the masking plug at a predetermined insertion distance measured from a masking plug outer surface to the head face to mask the cylinder bore;
    applying a corrosion resistant coating to substantially cover the head face after masking the cylinder bore with the masking plug;
    removing the masking plug from the cylinder bore; and
    machine finishing the engine block including the coating to the engine block specifications.

11. The method of claim 10, wherein the insertion tool includes a tool body with a tool body surface and an insertion feature with an insertion feature surface the insertion feature extending from the tool body at an insertion feature height measured from the tool body surface to the insertion feature surface, and wherein inserting the masking plug includes pushing the masking plug into the cylinder bore with the insertion feature until the tool body surface contacts the head face.

12. The method of claim 10, wherein the predetermined insertion distance is at least 0.050 millimeters.

13. The method of claim 10, wherein removing the masking plug from the cylinder bore includes machining the masking plug.

14. The method of claim 10, wherein applying the corrosion resistant coating to the top deck over the head face includes applying a feedstock using a wire arc spray method.

15. The method of claim 14, wherein the feedstock is a 95/5 nickel aluminum feedstock.

16. The method of claim 10, wherein the corrosion resistant coating includes from 80 to 95 percent nickel and from 5 to 20 percent aluminum.

17. The method of claim 10, wherein the predetermined surface roughness is at least 2032 nanometers.

18. The method of claim 10, further comprising masking other features in the block body located in the top deck including bolt holes, coolant passages and lifter windows by inserting masking plugs into the bolt holes, coolant passages, and lifter windows with the masking plugs protruding up to 4 millimeters from the head face.

\* \* \* \* \*